(12) United States Patent
Minamio et al.

(10) Patent No.: US 6,864,117 B2
(45) Date of Patent: Mar. 8, 2005

(54) METHOD FOR PRODUCING SOLID-STATE IMAGING DEVICE

(75) Inventors: Masanori Minamio, Takatsuki (JP); Hiroshi Horiki, Funai-gun (JP); Tetsushi Nishio, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/669,229

(22) Filed: Sep. 24, 2003

(65) Prior Publication Data

US 2004/0214369 A1 Oct. 28, 2004

(30) Foreign Application Priority Data

Apr. 28, 2003 (JP) ........................................ 2003-123842

(51) Int. Cl.[7] ............................................... H01L 21/00
(52) U.S. Cl. .......................................... 438/66; 257/432
(58) Field of Search .............................. 438/66, 64, 60; 257/432

(56) References Cited

U.S. PATENT DOCUMENTS 6,046,070 A * 4/2000 Shoji et al. .................... 438/66

FOREIGN PATENT DOCUMENTS

| JP | 2000-58805 | 2/2000 |
|---|---|---|
| JP | 2002-043554 | 2/2002 |

* cited by examiner

Primary Examiner—David Nelms
Assistant Examiner—Quoc Hoang
(74) Attorney, Agent, or Firm—Merchant & Gould P.C.

(57) ABSTRACT

A method for producing a solid-state imaging device including a base of an insulation material having a frame form in planar shape with an aperture formed in an inner region thereof and having a substantially uniform thickness; a wiring provided on one surface of the base and extending toward the outside from the peripheral portion of the aperture; and an imaging element mounted on the surface of the base provided with the wiring so that a light-receptive region of the element faces the aperture. Cavities for resin-molding a plurality of the bases are formed and a tape member supporting thin metal plate leads for forming a plurality of sets of wirings corresponding to the respective bases is loaded between molds having pins for forming positioning holes of the base; and the thin metal plate leads are placed in the cavities. Then, a sealing resin is filled in the cavities and cured. A resin molded member, in which the thin metal plate leads are embedded, is taken out; and the tape member is removed from the resin molded member, and the resin molded member is divided into a plurality of pieces on which an imaging element is mounted. The base on which the imaging element is mounted can be formed to have a practically sufficient flatness.

8 Claims, 6 Drawing Sheets

METHOD FOR PRODUCING SOLID-STATE IMAGING DEVICE

BACKGROUND OF THE INVENTION

1. Field of the Invention

The present invention relates to a method for producing a solid-state imaging device configured by mounting an imaging element such as a CCD on a base.

2. Related Background Art

Solid-state imaging devices are used widely for video cameras and still cameras, and the like, and are provided in a form of a package in which an imaging element such as a CCD is mounted on a base made of an insulation material and a light-receptive region is covered with a transparent plate. In order to miniaturize the device, the imaging element is mounted on the base while keeping a bare chip state (or example, see JP 2002-43554 A). A conventional example of such solid-state imaging devices will be explained with reference to FIG. 9.

A base 31 in FIG. 9 has a frame form in planar shape with an aperture 32 in its central portion and a cross-sectional shape having uniform thickness as a whole. A bottom surface of the base 31 is provided with a wiring 33 made of a plated gold layer, which extends from the vicinity of the aperture 32 to an outer peripheral end face. On the surface of the base 31 on which the wiring 33 is provided, an imaging element 4 such as a CCD and the like is mounted, with the light-receptive region 4a of the imaging element 4 facing the aperture portion 32. On the top surface of the base 31, a transparent plate 5 made of glass is attached so as to cover the aperture 32. The periphery of the imaging element 4 is filled with a sealing resin 6 so as to hermetically seal a gap between the end portion of the imaging element 4 and the base 31. As mentioned above, the light-receptive region 4a is placed within a closed space formed in the aperture 32.

On the same plane as that of the light-receptive region 4a of the image element 4, an electrode pad (not shown) connected to a circuit of the light-receptive region 4a is placed, and a bump (protrusion electrode) 7 is provided on the electrode pad. An internal end portion of the wiring 33 adjacent to the aperture 32 forms an internal terminal portion 33a, which is connected to the electrode pad of the imaging element 4 via the bump 7.

This solid-state imaging device is mounted on a circuit board with the side of the transparent plate 5 facing upward as shown in the drawing. A portion of the wiring 33 placed on the bottom surface of the outer peripheral end portion of the base 31 forms an external terminal portion 33b, which is used for the connection with an electrode on the circuit board. The external terminal portion 33b of each wiring 33 is provided with a solder ball 8, which is used for the connection with an electrode on the circuit board. Furthermore, the solder ball 8 also has a function of maintaining the base 31 at an appropriate height from the surface of the circuit board.

The upper part of the transparent plate 5 is to be provided with lens barrel (not shown) having an imaging optical system in a manner in which a relative positional relationship with the light-receptive region 4a is set at a predetermined accuracy. Through the imaging optical system incorporated in the lens barrel, light from an object to be imaged is collected onto the light receiving region 4a and a photoelectric conversion is carried out.

However, it is difficult to obtain a sufficient flatness of the base 31 with the configuration of the above-mentioned conventional solid-state imaging device. That is to say, since the base 31 has a frame shape with the aperture portion 32, when resin molding is carried out, a curl and a warp in the cross-sectional shape may be generated. When the flatness of the surface on which the imaging element 4 is mounted is insufficient, the position of the imaging element 4 becomes unstable. As a result, the position of the lens barrel with respect to the light-receptive region 4a cannot be determined accurately.

Furthermore, although there is no description in JP2002-43554 A, in the conventional examples, since the wiring 33 is formed by plating, a process for applying the plating to the base 31 is complicated, which may lead to a high cost, and further the formed wiring 33 tends to have variation in dimensional accuracy.

SUMMARY OF THE INVENTION

With the foregoing in mind, it is an object of the present invention to provide a method for producing a base on which an imaging element is mounted, the method capable of producing a plurality of bases at one time efficiently with practically sufficient flatness. It is another object of the present invention to provide a method for producing a solid-state imaging device, capable of providing wirings with reduced variation in dimensional accuracy at low cost.

A method of the present invention is for producing a solid-state imaging device including a base of an insulation material having a frame form in planar shape with an aperture formed in an inner region thereof and having a substantially uniform thickness; a wiring provided on one surface of the base and extending toward the outside from the peripheral portion of the aperture; and an imaging element mounted on the surface of the base provided with the wiring so that a light-receptive region of the element faces the aperture. The wiring includes an internal terminal portion at the end portion on the aperture side and an external terminal portion at the end portion on the outer peripheral side of the base, and the electrode of the imaging element and the internal terminal portion are connected electrically.

In order to solve the above-mentioned problem, in the method of the present invention, a pair of molds for forming cavities for resin-molding a plurality of the bases and a tape member supporting thin metal plate leads for forming a plurality of sets of the wirings corresponding to the respective bases are used. The mold is provided with a plurality of pins for forming a plurality of positioning holes in thickness direction of the base. The tape member is loaded between the pair of molds so that the thin metal plate leads are positioned in the regions corresponding to the plurality of bases in the cavities. A sealing resin is filled in the cavities and cured; a resin molded member, in which the thin metal plate leads are embedded, is taken out of the molds; and the tape member is removed from the resin molded member. The resin molded member is divided into a plurality of pieces, each of which corresponds to the base provided with the wiring; and the imaging element is mounted on a face of the base provided with the wirings.

DESCRIPTION OF THE PREFERRED EMBODIMENTS

Figure 1:
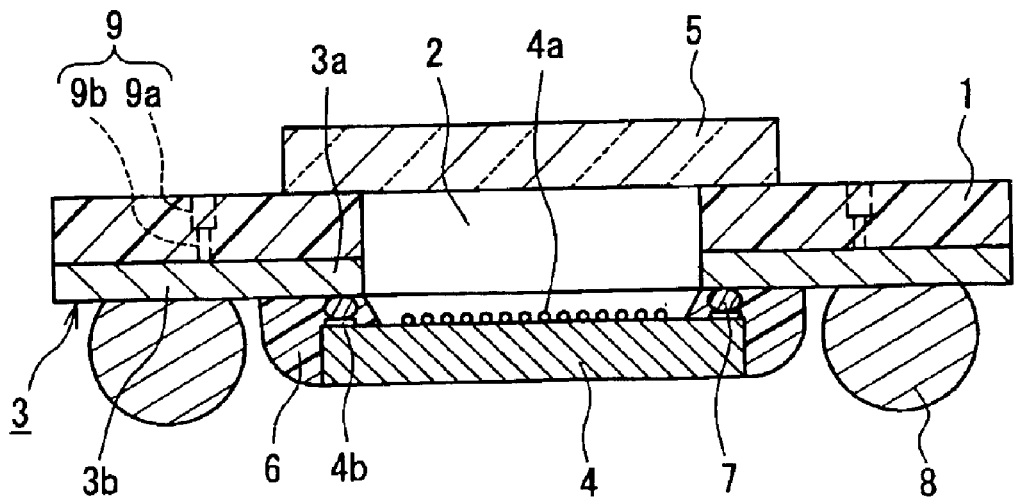
FIG. 1 is a cross-sectional view showing a solid-state imaging device according to a first embodiment.

In a method for producing a solid-state imaging device of the present invention, by using a pair of molds for forming cavities for resin molding a plurality of the bases and a tape member supporting thin metal plate leads for forming a plurality of sets of wirings corresponding to the respective bases, thin metal plate leads are embedded during the molding process of the base. The rigidity of the base is increased by the thin metal plate leads used for the wiring and the generation of a curl and a warp of the base is suppressed.

The resin molded member taken out of the mold may be pressed between the flat molds forming a pair of parallel faces under heating so as to carry out remedial curing. Thus, it is possible to further improve the flatness of the base. Since the base produced by the above-mentioned method does not have substantially a convex-concave shape, it is suitably for remedial curing.

In the above-mentioned producing method, the cavities may be formed by using a pair of molds and blocks disposed between the pair of molds for forming an aperture of the base. After filling a sealing resin in the cavities and curing it; a resin molded member, in which the thin metal plate leads are embedded and the block is held, is taken out of the molds; the tape member and the block are removed from the resin molded member; and the resin molded member is divided into a plurality of pieces each of which corresponds to the base provided with the wiring. Preferably, after the resin molded member in which the block is held is taken out of the mold, the resin molded member is pressed between a pair of parallel flat molds under heating condition so as to be subjected to remedial curing.

In the above-mentioned producing method, the block as well as the thin metal plate lead may be supported on the tape member, and the tape member is sandwiched between the pair of molds to form the cavities, and the thin metal plate leads are placed in the cavities. In this case, it is preferable that the end face of the block is tilted in such a manner that an angle made by the end face and the bottom face of the block on the side of the tape member is less than 90°. Thus, the end face of the base at the side of the aperture can be tilted easily, enabling the reflection of incident light to the light-receptive region to be adjusted in the range without adversely affecting the imaging function.

In the producing method, it is preferable that when the tape member is removed from the resin molded member, flash of the resin molded member is removed together with the tape member in a state of attachment to the tape member. In order to do so, it is preferable that the dimensions of the pair of molds, the plurality of pins, the block and the tape member are set so that when the tape member is interposed between the pair of molds, the tip portion of the protrusion of the mold for forming an aperture of the base and at least one of the tip portions of the plurality of pins or the block are intruded into the tape member.

Hereinafter, the embodiment of the present invention will be specifically mentioned with reference to drawings.

(First Embodiment)

Figure 9:
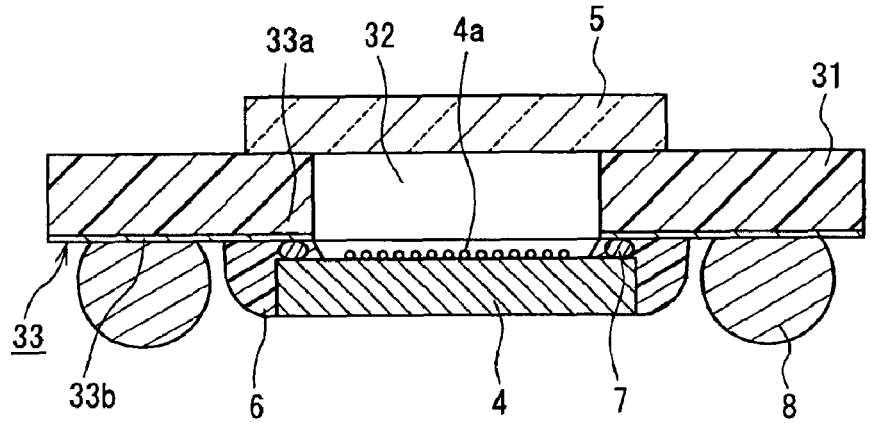
FIG. 9 is a cross-sectional view showing a solid-state imaging device of a conventional example.

The method for producing a solid-state imaging device according to the first embodiment will be explained with reference to FIGS. 1 to 3. The production method of this embodiment will be applied to a solid-state imaging device having a structure shown in FIG. 1. The solid-state imaging device of FIG. 1 has a similar schematic structure to that shown in FIG. 9 and the same reference numbers are given to the same elements and explanation therefor is simplified herein.

The solid-state imaging device of the first embodiment is different from that of the conventional example in the structure of a wiring 3 provided on the base 1. The base 1 is made of an insulating material such as a plastic resin, for example, epoxy resin, etc., and has a frame form in planar shape with a rectangular aperture 2 in the central portion thereof. The base 1 is a flat plate in cross-sectional shape having substantially a uniform thickness as a whole. The bottom surface of the base 1 is provided with a plurality of wirings 3 made of thin metal plate leads extending from the peripheral portion of the aperture 2 to an outer peripheral end of the base 1. As the thin metal plate lead, for example, Cu alloy, 42 alloy (Fe—Ni 42 alloy) and the like, which are similar to the materials used for a normal lead frame, are used and the thickness thereof is about 2 $\mu$m to 3 $\mu$m.

On the face of the base 1 on which the wiring 3 is formed, an imaging element 4 such as a CCD and the like formed on a Si base is fixed and the electrode 4b thereof is connected to the wiring 3. The internal end portion adjacent to the aperture 2 of each wiring 3 forms an internal terminal portion 3a, which is connected to an electrode pad of the imaging element 4 via the bump 7. The outer peripheral end portion of each of the wirings 3 forms an external terminal portion 3b, which is used for connecting to the electrode on the circuit board.

Figures 2A, 2B:
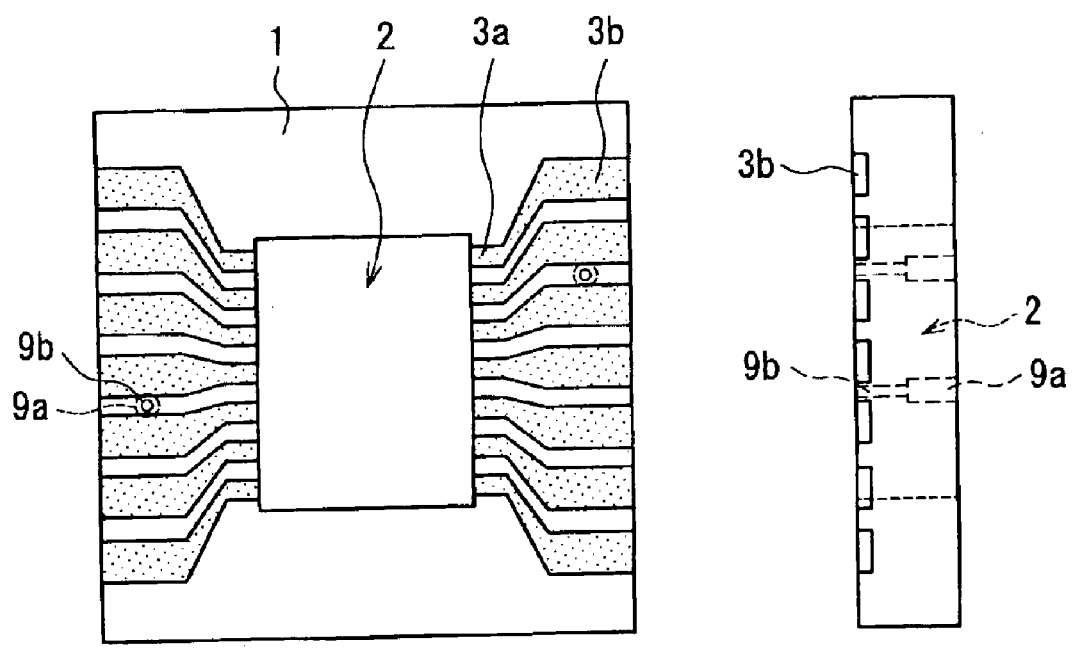
FIG. 2A is a plan view showing a base constituting the solid-state imaging device of FIG. 1 viewed from the rear face.
FIG. 2B is a side view thereof.

The base 1 is formed by embedding a plurality of thin metal plate leads constituting each wiring 3 into a resin. A structure of the base 1 into which thin metal plate leads constituting the wiring 3 are embedded will be explained with reference to FIGS. 2A and 2B. FIG. 2A is a plan view showing the base 1 before the imaging element 4 is mounted thereon, when FIG. 1 is viewed from the rear side; and FIG. 2B is a side view thereof.

As shown in FIG. 2A, the entire bottom surface of the wiring 3 is exposed. On the other hand, as shown in FIG. 2B, the side edge faces of the wiring 3 are embedded in the resin constituting the base 1. Therefore, the frame shape of the base 1 is reinforced by a thin metal plate lead, so that the flatness of the top and bottom faces is excellent. That is to say, since the thin metal plate lead is embedded, the rigidity is increased so as to resist the internal stress that generates a curl or a warp and the flatness of the frame shape can be maintained. As a result, the position of the imaging element 4 mounted on the surface of the base 1 becomes stable and the position of the lens barrel with respect to the light-receptive region 4a can be determined easily. The entire side edge faces of the wiring 3 are not necessarily embedded as shown in the drawing. The degree of the embedding can be adjusted depending on the other conditions, as long as the degree is sufficient for obtaining the above-mentioned effects.

Furthermore, thin metal plate leads can be produced with high dimensional accuracy and less variation at low cost by a process of cutting metal plates.

On the base 1, a plurality of positioning holes 9 (two holes are shown in the drawing) are formed. The positioning holes 9 include a large diameter portion 9a on the upper face side and a small diameter portion 9b on the lower face side, which are formed concentrically. As shown in FIG. 2A, the positioning holes 9 are arranged so as not to overlap with the wiring 3, and the small diameter portion 9b is exposed to the rear face. The position of this small diameter portion 9b is detected by an image recognition apparatus and the like, and then the position of the imaging element 4 can be determined with respect to the position of the small diameter portion 9b at the time of mounting the imaging element 4. In addition, when the planar position of the lens barrel is determined with respect to the imaging element, the positioning can be carried out with high accuracy based on the large diameter portion 9a. The position of the lens barrel can be determined easily, for example, by fitting a pin provided at the lower portion of the lens barrel into the large diameter portion 9a.

As shown in the drawing, preferably, a plurality of positioning holes 9 are arranged asymmetrically in the planar shape of the base 1. Thus, the positioning holes can be used for recognizing the orientation of the base 1. Furthermore, the same effects can be achieved by arranging a plurality of positioning holes having different diameters.

By making the base 1 flat as mentioned above, the following advantages can be obtained, in addition to the easiness of the resin molding. That is to say, after the resin molding, a process for curing the deformation of the base 1 can be carried out easily in order to improve the flatness of the base 1.

The method for producing a solid-state imaging device according to this embodiment includes a process of producing a plurality of bases at one time with excellent flatness in producing the solid state imaging device having the above-mentioned configuration. This producing method will be explained with reference to FIGS. 3 and 4.

Figure 3A:
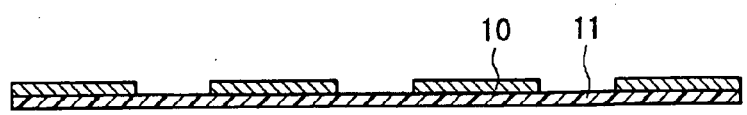
FIGS. 3A to 3F are cross-sectional views showing processes for producing the solid-state imaging device of FIG. 1.

First of all, as shown in FIG. 3A, a tape member 11 with thin metal plate leads 10 supported thereon is prepared. The thin metal plate leads 10 are configured in a lead frame. The number, dimension, and arrangement of thin metal plate leads 10 are set to be appropriate for composing the wiring 3 of the above-mentioned solid-state imaging device. Furthermore, a plurality of thin metal plate leads 10 are arranged so as to correspond to a plurality of bases for composing a plurality of solid-state imaging devices.

Figure 3B:
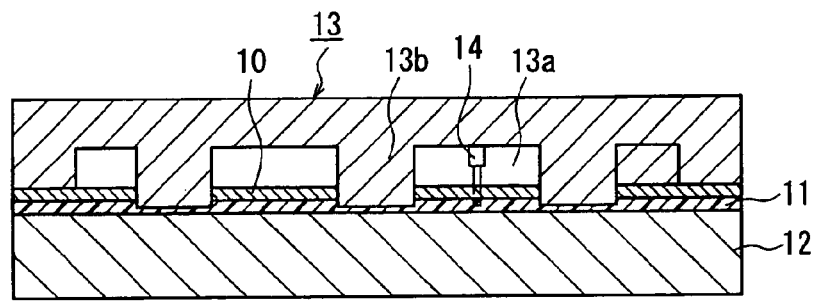

Next, as shown in FIG. 3B, a lower mold 12 and an upper mold 13 are placed facing each other with the tape member 11 sandwiched therebetween. The upper mold 13 is provided with recesses 13a for forming spaces corresponding to a plurality of bases 1. In the recess 13a, a plurality of protrusion portions 13b is provided so as to correspond to the apertures 2 of the base 1. Therefore, the recess 13a and protrusion 13b form a cavity corresponding to the shape of the base 1 with the aperture 2. The upper mold 13 is further provided with a pin 14 for forming the positioning hole 9 in the base 1. The tape member 11 is positioned so that each of thin metal plate leads 10 supported thereon is positioned appropriately in each cavity. In this state, the dimension of the molds 12 and 13, the pin 14 and the tape member 11 may be set so that the protrusion 13b of the upper mold 13 and the tip portion of the pin 14 intrude into the tape member 11. Thereby, when the tape member 11 is removed after resin molding, flash of the resin molded member formed in molding can be removed in a state of attachement to the tape member.

Figure 3C:
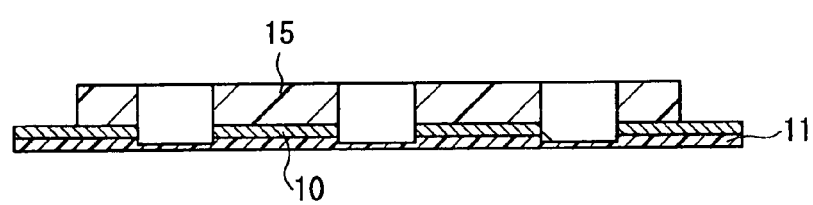

The cavities formed between the lower mold 12 and the upper mold 13 are filled with a resin so as to be cured, followed by opening the lower mold 12 and the upper mold 13, and thereby a resin molded member 15 as shown in FIG. 3C is taken out. A thin metal plate lead 10 is embedded in the bottom face of the resin molded member 15.

Figure 3D:
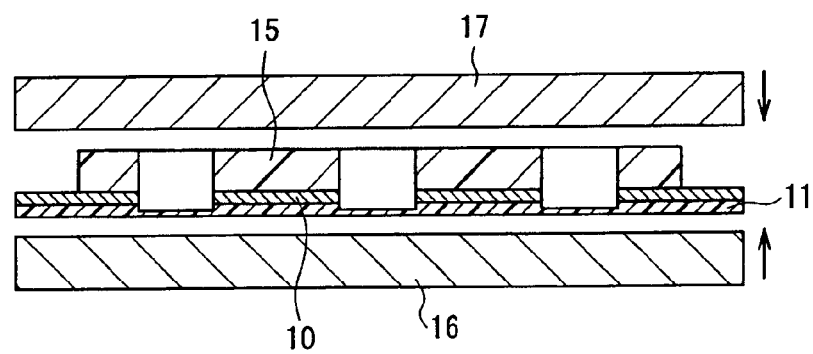

In this state, as shown in FIG. 3D, the resin molded member 15 in which the thin metal plate lead 10 is embedded is pressed by using a pair of parallel flat molds 16 and 17 under heat. Thus, remedial curing for reducing a warp of the resin molded member 15 is carried out. Depending on the other various conditions, excellent results can be obtained, at a heating temperature from 100 to 200° C. and a pressure from 1 to 30 Kg.

Figure 3E:
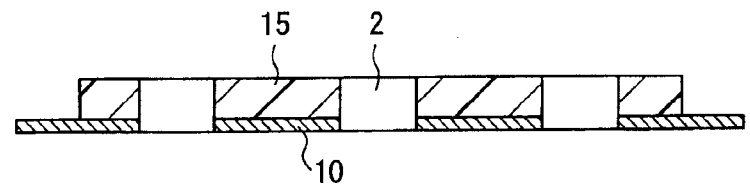
Figure 3F:
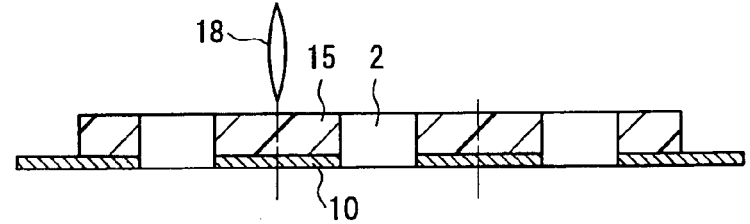
Figure 4:
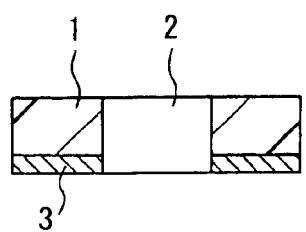
FIG. 4 is a cross-sectional view showing a base produced by the processes of FIGS. 3A to 3F.

Next, as shown in FIG. 3E, the tape member 11 is peeled off, and the resin molded member 15 is divided into pieces by using a dicing saw 18 as shown in FIG. 3F, and thereby a base 1 shown in FIG. 4 can be obtained. On this base 1, the imaging element 4 is mounted as shown in FIG. 1 and a transparent plate 5 is fixed. Thus, a solid-state imaging device is produced.

In the above-mentioned molding process, by embedding the thin metal plate lead 10 of a lead frame form into the resin molded member 15, it is possible to suppress the generation of a curl or a warp of the base 1. Any remaining curl or warp is reduced by the process of remedial curing shown in FIG. 3D, so that it is possible to obtain the base 1 with the further improved flatness. If the resin molded member 15 as molded has less curl and warp and practically sufficient degree of flatness can be obtained, the process of remedial curing is not necessary.

(Second Embodiment)

A method for producing a solid-state imaging device according to a second embodiment will be explained with reference to FIG. 5. The method of this embodiment is different from the method of the first embodiment in the configuration of a mold for producing a base.

Figure 5A:
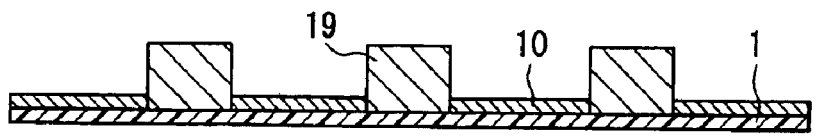
FIGS. 5A to 5F are cross-sectional views showing processes of a method for producing a solid-state imaging device according to a second embodiment.

First of all, as shown in FIG. 5A, a tape member 11 with thin metal plate leads 10 supported thereon is prepared. The thin metal plate leads 10 are configured in a lead frame. In this embodiment, a block 19 as well as the thin metal plate lead 10 are supported on the tape member 11. The block 19 may be made of a Cu-based material, a Fe-based material, an Al-based material and the like and used for forming apertures 2 of the base 1.

Figure 5B:
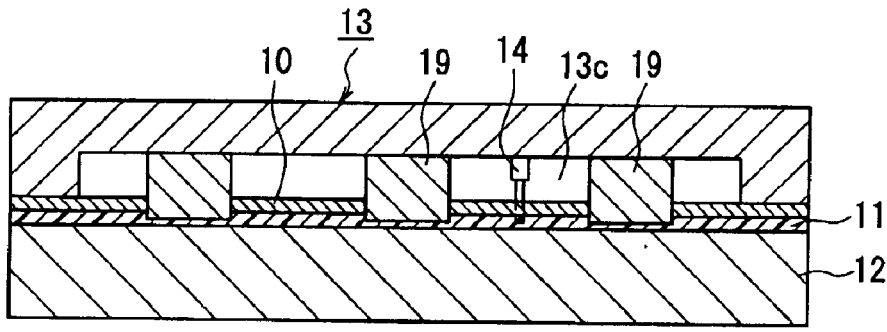

Next, as shown in FIG. 5B, a lower mold 12 and an upper mold 13 are placed facing each other with the tape member 11 sandwiched therebetween. The upper mold 13 is provided with a recess 13c for forming a rectangular-shaped space. In the recess 13c, a plurality of blocks 19 are placed, thereby in the recess 13c, a plurality of cavities corresponding to the shape of the base 1 including apertures 2 are formed. The tape member 11 is positioned so that the thin metal plate leads 10 supported thereon are arranged appropriately in the cavity. The position of the thin metal plate leads 10 with respect to the blocks 19 in the recess 13c is determined on the tape member 11.

Figure 5C:
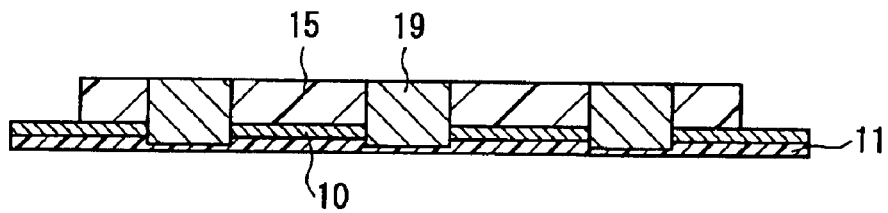

The cavities formed by the recess 13c and the block 19 are filled with resin to be cured, followed by detaching the lower mold 12 and the upper mold 13, and thereby a resin molded member 15 as shown in FIG. 5C is taken out. On the bottom face of the resin molded member 15, the thin metal plate lead 10 is embedded. At this stage, the block 19 still is disposed in the position corresponding to the aperture 2.

Figure 5D:
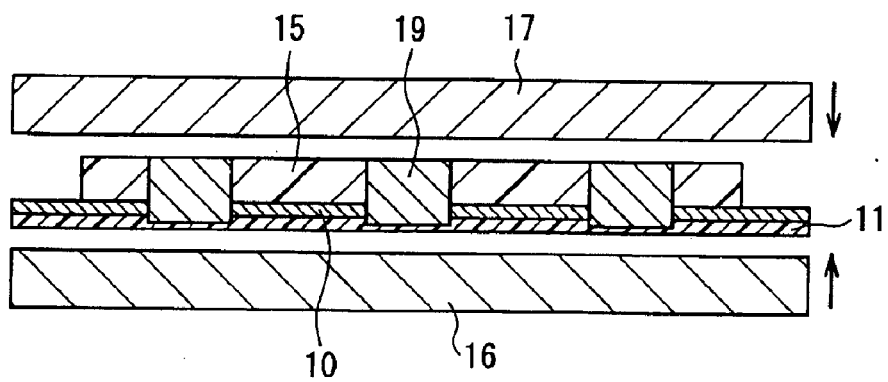

In this state, as shown in FIG. 5D, the resin molded member 15 in which a thin metal plate lead 10 is embedded is pressed by a pair of parallel flat molds 16 and 17 under heat. Thus, remedial curing for reducing a warp of the resin molded member 15 is carried out.

Figure 5E:
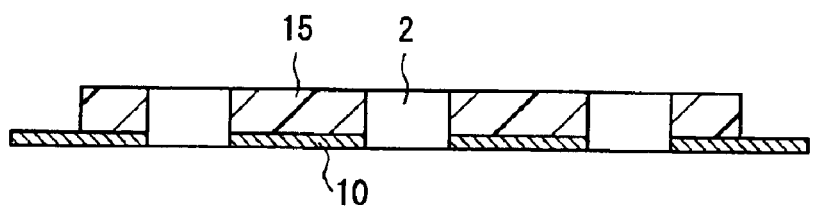
Figure 5F:
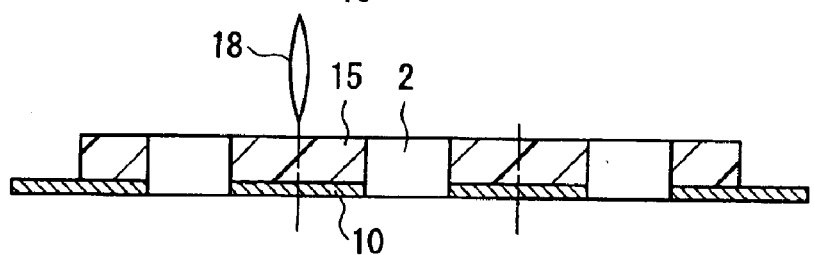

Next, as shown in FIG. 5E, the tape member is peeled off and the block 19 is pulled out, followed by dividing the resin molded member 15 into pieces by using a dicing saw 18 as shown in FIG. 5F. Thereby, a base 1 shown in FIG. 4 can be obtained. On this base 1, the imaging element 4 is mounted as shown in FIG. 1 and a transparent plate 5 is fixed. Thus, a solid-state imaging device is completed.

In the above-mentioned molding process, by embedding the thin metal plate lead 10 of a lead frame form into the resin molded member 15, it is possible to suppress the generation of a curl or a warp of the base 1. Any remaining curl or warp is reduced by the process of remedial curing shown in FIG. 5D, so that it is possible to obtain the base 1 with the further improved flatness. If the resin molded member 15 as molded has less curl and warp and a practically sufficient degree of flatness can be obtained, the process of remedial curing is not necessarily required.

(Third Embodiment)

Figure 6:
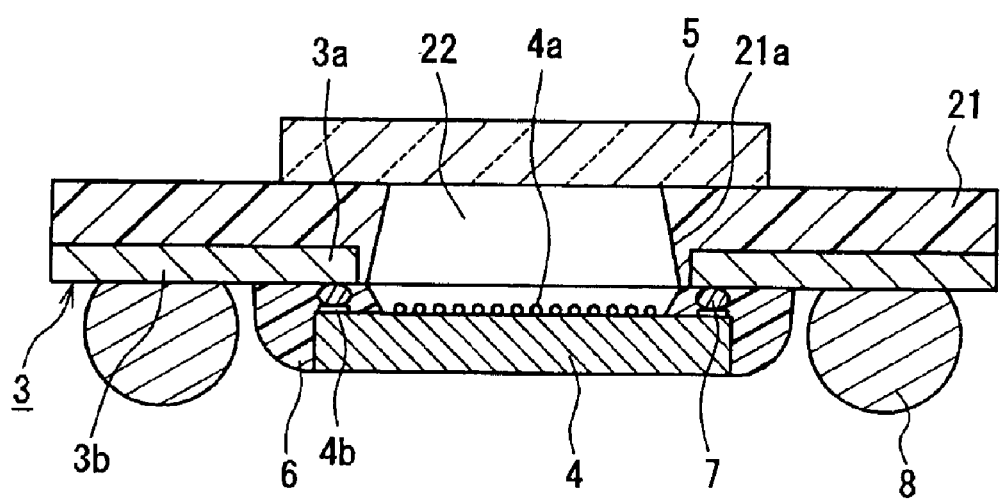
FIG. 6 is a cross-sectional view showing a solid-state imaging device according to a third embodiment.

A method for producing the solid-state imaging device according to the third embodiment will be explained with reference to FIGS. 6 to 8. The producing method of this embodiment is applied to a solid-state imaging device having a structure shown in FIG. 6. This structure is substantially the same as the structure in the first embodiment shown in FIG. 1. This embodiment is different from the first embodiment in the cross-sectional shape of the internal end face 21a of the substrate 21 facing the aperture 22. The internal end face 21a is not perpendicular to the upper and lower surfaces of the base 21 but is tilted at a predetermined angle. Specifically, the internal end face 21a is tilted in such a manner that the internal end face 21a makes an angle larger than 90° with respect to a surface of the base 21 at which the imaging element 4 is mounted. Since the internal end face 21a has such a tilted shape, inappropriate reflection of incident light with respect to the light-receptive region 4a due to the internal end face 21a is reduced. It is desirable that the above-mentioned angle is in the range from 90° to 120°.

The method for producing the solid-state imaging device having this configuration will be explained with reference to FIG. 7. In this producing method, the shape of the block 19 used for the second embodiment is modified.

Figure 7A:
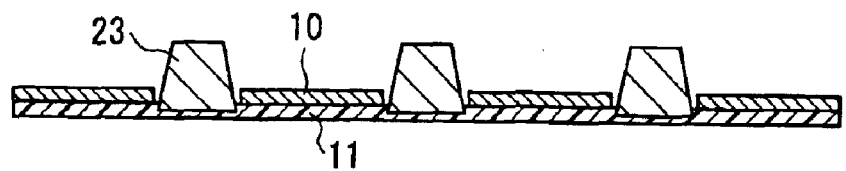
FIGS. 7A to 7F are cross-sectional views showing processes for producing the solid-state imaging device of FIG. 6.
Figure 8:
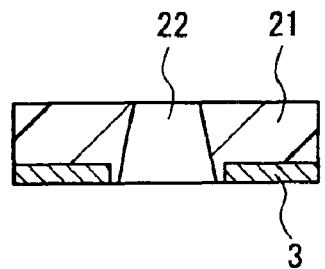
FIG. 8 is a cross-sectional view showing a base produced by the processes of FIGS. 7A to 7F.

First of all, as shown in FIG. 7A, a tape member 11 supporting thin metal plate leads 10 and blocks 23 are prepared. The thin metal plate leads 10 are configured in a lead frame. The block 23 is made of the material similar to that of the first embodiment and used for forming the aperture 22 of the base 21. The end face of the block 23 is tilted in such a manner that an angle between the end face and the bottom face of the block at the tape member 11 side is smaller than 90°.

Figure 7B:
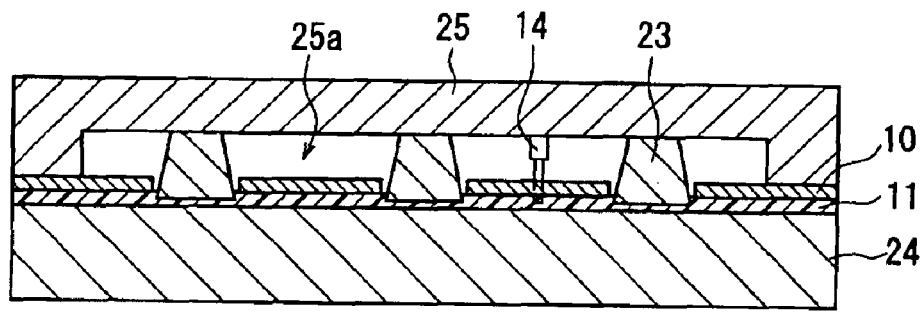
Figure 7C:
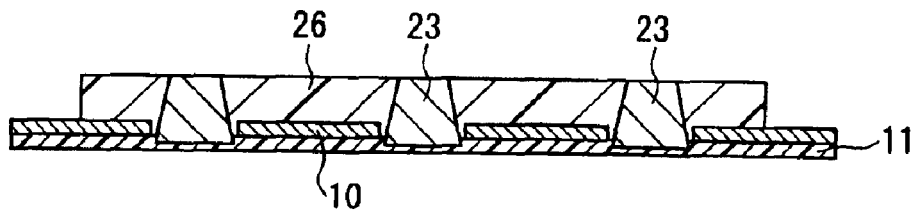

Next, as shown in FIG. 7B, a lower mold 24 and an upper mold 25 are placed facing each other with the tape member 11 sandwiched therebetween. The upper mold 25 is provided with a recess 25a for forming a rectangular shaped space. The block 23 is placed in the recess 25a. Thus, cavities corresponding to the shape of the base 21 including the apertures 22 can be formed in the recess 25a. The position of each of the thin metal plate leads 10 with respect to the block 23 in the recess 25a is determined on the tape member 11.

The cavities formed by the recess 25a are filled with a resin so as to be cured, followed by detaching the lower mold 24 and the upper mold 25, and thereby a resin molded member 26 as shown in FIG. 3C is taken out. In the bottom face of the resin molded member 26, a thin metal plate lead 10 is embedded. At this stage, the block 23 still is disposed in the position corresponding to the aperture 22.

Figure 7D:
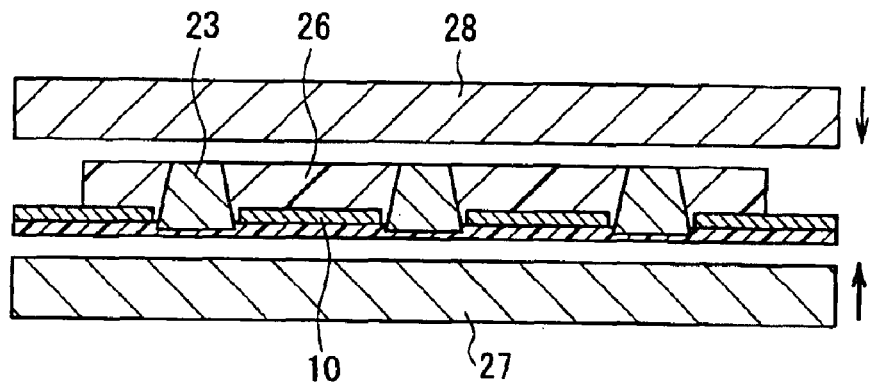
Figure 7E:
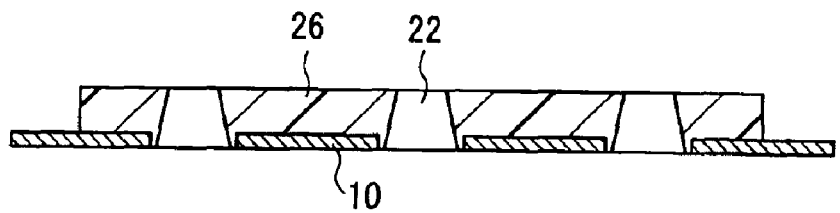
Figure 7F:
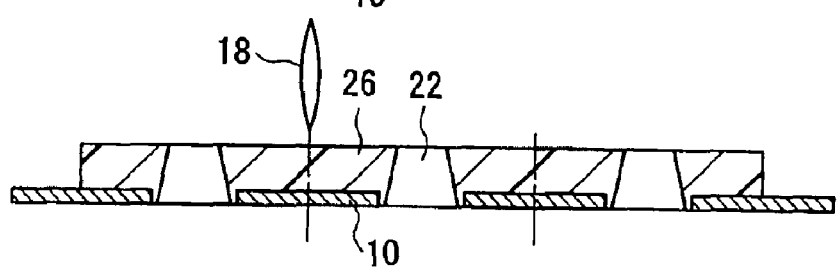

In this state, as shown in FIG. 7D, the resin molded member 26 in which a thin metal plate lead 10 is embedded is pressed by using a pair of parallel flat molds 27 and 28 under heat. Thus, remedial curing for reducing a warp of the resin molded member 26 is carried out. Next, as shown in FIG. 7E, the tape member 11 is peeled off and the block 23 is pulled out, followed by dividing the resin molded member 26 into pieces by using a dicing saw 18 as shown in FIG. 7F. Thereby, a base 21 shown in FIG. 8 can be obtained. On this base 21, the imaging element 4 is mounted as shown in FIG. 6 and a transparent plate 5 is fixed. Thus, a solid-state imaging device is completed.

In the above-mentioned molding process, by embedding a thin metal plate lead 10 into the resin molded member 26 and by carrying out the process of remedial curing shown in FIG. 7D, it is possible to reduce a curl or a warp of the base 21 and to obtain the base 21 with high degree of flatness, which is the same as in Embodiment 1. In addition, according to this embodiment, as shown in FIG. 6, it is easy to allow the internal end face 21a of the base 21 to be tilted.

Note here that, in the above explanation, the example of molding a plurality of bases at one time was explained. However, in the case where a single base is molded, each embodiment can be applied similarly.

The invention may be embodied in other specific forms without departing from the spirit or essential characteristics thereof The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A method for producing a solid-state imaging device comprising: a base of an insulating material having a frame form in planar shape with an aperture formed in an inner region thereof and having a substantially uniform thickness; a wiring provided on one surface of the base and extending toward the outside from the peripheral portion of the aperture; and an imaging element mounted on the surface of the base provided with the wiring so that a light-receptive region of the element faces the aperture, wherein the wiring includes an internal terminal portion at the end portion on the aperture side and an external terminal portion at the end portion on the outer peripheral side of the base, and the electrode of the imaging element and the internal terminal portion are electrically connected, the method comprising:

using a pair of molds for forming cavities for resin-molding a plurality of the bases and a tape member supporting thin metal plate leads for forming a plurality of sets of the wirings corresponding to the respective bases, the mold being provided with a plurality of pins for forming a plurality of positioning holes in thickness direction of the base; loading the tape member between the pair of molds so that the thin metal plate leads are positioned in the regions corresponding to the plurality of bases in the cavities; filling a sealing resin in the cavities and curing it;

taking a resin molded member, in which the thin metal plate leads are embedded, out of the molds;

removing the tape member from the resin molded member; dividing the resin molded member into a plurality of pieces each of which corresponds to the base provided with the wiring; and mounting the imaging element on a face of the base provided with the wirings.

2. The method for producing a solid-state imaging device according to claim 1, wherein the resin molded member taken out of the mold is pressed between a pair of parallel flat molds so as to carry out remedial curing.

3. The method for producing a solid-state imaging device according to claim 1, wherein
the cavities are formed by using a pair of molds and blocks disposed between the pair of molds for forming an aperture of the base,
after filling a sealing resin in the cavities and curing it, a resin molded member, in which the thin metal plate leads are embedded and the block is held, is taken out of the molds;
the tape member and the block are removed from the resin molded member; and
the resin molded member is divided into a plurality of pieces, each of which corresponds to the base provided with the wiring.

4. The method for producing a solid-state imaging device according to claim 3, wherein the block as well as the thin metal plate lead are supported on the tape member, and the tape member is sandwiched between the pair of molds to form the cavities, and the thin metal plate leads are placed in the cavities.

5. The method for producing a solid-state imaging device according to claim 4, wherein the end face of the block is tilted in such a manner that an angle made by the end face and the bottom face of the block on the side of the tape member is less than 90°.

6. The method for producing a solid-state imaging device according to claim 1, wherein after the resin molded member in which the block is held is taken out of the mold, the resin molded member is pressed between a pair of parallel flat molds under heating condition so as to be subjected to remedial curing.

7. The method for producing a solid-state imaging device according to claim 1, wherein when the tape member is removed from the resin molded member, flash of the resin molded member is removed together with the tape member in a state of attachment to the tape member.

8. The method for producing a solid-state imaging device according to claim 7, wherein the dimensions of the pair of molds, the plurality of pins, the block and the tape member are set so that when the tape member is interposed between the pair of molds, the tip portion of the protrusion of the mold for forming an aperture of the base and at least one of the tip portions of the plurality of pins or the block are intruded into the tape member.

* * * * *